United States Patent [19]
Davis

[11] Patent Number: 5,276,697
[45] Date of Patent: Jan. 4, 1994

[54] LASER DIODE AUTOMATIC POWER CONTROL CIRCUIT WITH MEANS OF PROTECTION OF THE LASER DIODE

[75] Inventor: James G. Davis, Rochester, N.Y.

[73] Assignee: Eastman Kodak Company, Rochester, N.Y.

[21] Appl. No.: 971,374

[22] Filed: Nov. 4, 1992

[51] Int. Cl.$^5$ .............................................. H01S 3/00
[52] U.S. Cl. ........................................ 372/38; 372/34; 372/29; 372/26; 372/31
[58] Field of Search ................ 372/38, 34, 29, 31, 372/26; 330/207

[56] References Cited

U.S. PATENT DOCUMENTS

| | | | |
|---|---|---|---|
| H322 | 8/1987 | Simons ................................. | 372/38 |
| 4,074,334 | 2/1978 | D'Arrigo et al. ................. | 330/207 P |
| 4,501,022 | 2/1985 | Oswald ............................. | 455/601 |
| 4,507,767 | 3/1985 | Takasugi ........................... | 369/54 |
| 4,612,671 | 9/1986 | Giles ................................. | 455/609 |
| 4,791,636 | 12/1988 | Yamamoto et al. ............. | 372/46 |
| 4,872,080 | 10/1989 | Hentschel et al. .............. | 361/57 |
| 4,890,288 | 12/1989 | Inuyama et al. ................. | 372/31 |
| 5,019,769 | 5/1991 | Levinson .......................... | 372/31 |
| 5,119,391 | 6/1992 | Maeda et al. .................... | 372/38 |

Primary Examiner—Léon Scott, Jr.
Attorney, Agent, or Firm—William F. Noval

[57] ABSTRACT

A laser imaging system includes a laser diode and an automatic power control circuit with a laser diode protection circuit. The protection circuit includes a shunt circuit for shunting power around the laser diode in response to one or more of the following conditions: laser light power over a predetermined maximum value, temperature of the laser diode is below or above a predetermined temperature range, the electrical power supply is below or above predetermined voltage values during power up and power down.

3 Claims, 9 Drawing Sheets

LASER DIODE AUTOMATIC POWER CONTROL CIRCUIT WITH MEANS OF PROTECTION OF THE LASER DIODE

FIELD OF THE INVENTION

This invention relates in general to laser diodes and, more particularly, to an automatic power control circuit with means of protecting the laser diode from over power, over or under temperature, and transient voltage or current spikes on power up and power down conditions.

BACKGROUND OF THE INVENTION

The laser diode has been used frequently as a light source in a variety of photographic applications. For example, in the field of laser printing, a laser beam is focused through a lens and then scanned onto a photosensitive medium, such as film. The laser diode is often controlled by digital data stored in a computer. Image quality may be improved by forming an image from pixels having varying gray tones to form a continuous tone image in film. The continuous tone radiographic laser printer is one application in which a laser diode is used to expose radiographic film to electronic images produced by medical imaging modalities, such as computed tomography, magnetic resonance imaging, digital subtraction angiography, ultrasonic imaging, and the like.

A problem with laser diodes is that the illuminative output of a semiconductor laser diode is not linear across its entire operating range. More specifically, as shown in FIG. 11 (which is a typical graph of light output P of a laser diode as a function of current I), the resulting curve has a lower level non-linear operating region joined by a knee region to a higher level operating region where light output varies linearly as a function of input signal value. The linear region is known as the lasing region and the non-linear lower level region is known as the light emitting or spontaneous emission region. The curve includes (1) a lower portion between 0 and the knee current $I_k$ where the resulting optical power output $P_d$ varies in a non-linear manner as current $I_d$ changes, and (2) a second higher portion between $I_k$ and $I_{max}$ where optical power output varies linearly with changes in current $I_d$. Because the non-linear region is unsatisfactory for generating a continuous tone image in response to image input signal levels, it is desirable that the laser output range be limited to the linear operating region. It is thus common practice to operate a laser diode at or above a predetermined current level called a threshold current.

Problems arise in automatically setting and maintaining a constant laser output power. Other problems arise in protecting the laser diode from overpower, over and under temperature and transient voltage or current spikes on power up and down conditions. U.S. Pat. No. 4,507,767, issued Mar. 26, 1983, inventor Takasugi, discloses an optical disk device including a laser diode as a light source which includes a protection circuit in parallel with the semi-conductor laser, in which the protection circuit is put in a short-circuited state between two terminals thereof, when a monitor signal corresponding to the light output of the semi-conductor laser exceeds a predetermined value. There is no disclosure in this patent of protection of the semi-conductor laser diode due to under or over temperature conditions, or power on and power off voltage and current spikes.

U.S. Pat. No. 4,872,080, issued Oct. 3, 1989, inventors Hentschel et al., discloses a protective circuit for a semiconductor laser supplied with an excitation current by a current generator circuit. The protective circuit includes a transducer whose output is controlled by the laser light, a limit circuit cooperating with the transducer and a current shunt circuit energized by the limit circuit and switched in parallel with the semi-conductor laser. Once the permissible emitted light power is reached, excessive excitation current is diverted to the shunt circuit. There is no disclosure in this patent of protecting the laser diode from over or under temperature conditions, among other problems.

U.S. Pat. No. 4,791,636, issued Dec. 13, 1988, inventors Yamamoto et al, discloses a semi-conductor laser comprising a laser oscillating optical waveguide composed of a control region which functions to absorb light and main regions which function to oscillate laser light, wherein the laser device includes a shunting means by which the ratio of the current flowing to the control region to the total current injected into the laser device is set according to a predetermined algorithm.

U.S. Pat. No. 4,074,334, issued Feb. 14, 1978, inventors D'Arrigo, et al., discloses a protective device for limiting the current flow through a power transistor, a normally nonconductive shunt transistor is turned on to shunt current around the power transistor when collector current and collector-emitter voltage exceed a selected current/voltage curve. There is no monitoring disclosed in this patent of over or under temperature conditions.

The following U.S. Patents disclose various laser diode control techniques which do not sufficiently solve the problems of automatic power control and protection of a laser diode: U.S. Pat. No. 5,019,769, issued May 28, 1991, inventor Levinson; U.S. Statutory Invention Registration No. H322, published Aug. 4, 1987, inventor Simons; U.S. Pat. No. 4,890,288, issued Dec. 26, 1989, inventors Inuyama et al; U.S. Pat. No. 4,501,022, issued Feb. 19, 1985, inventor Oswald; and U.S. Pat. No. 4,612,671, issued Sept. 16, 1986, inventor Giles.

SUMMARY OF THE INVENTION

According to the present invention, there is provided a solution to the problems of the prior art relating to automatic power control and protection of a laser diode. According to a feature of the present invention, a laser diode automatic power control circuit includes means for protecting the laser diode from over power conditions, over and under temperature conditions and transient voltage or current spikes on power up and down conditions. The laser imaging apparatus of the present invention includes a laser diode for producing a laser light output, an electrical power supply for supplying electrical power to said laser diode, a shunt circuit for shunting power around said laser diode, a laser power monitor for monitoring the laser light output of said laser diode, a thermal monitor for monitoring the temperature of said laser diode, a power supply monitor for monitoring the voltage power supply driving said laser diode and control means for controlling said shunt means to shunt power around said laser diode in response to one or more of the following signals:

a) said laser light power monitor means detects laser light form said laser diode over a predetermined maximum level;
b) said thermal monitor means detects whether the temperature of said laser diode is below or above a predetermined temperature range; and
c) said electrical power supply monitor means detects whether electrical voltage supplied by said supply to said laser diode is below or above predetermined voltage values.

BRIEF DESCRIPTION OF THE DRAWINGS

In a detailed description of the preferred embodiments of the invention presented below, reference is made to the accompanying drawings in which like numerals refer to like elements.

DETAILED DESCRIPTION OF THE PREFERRED EMBODIMENTS

Figure 12:
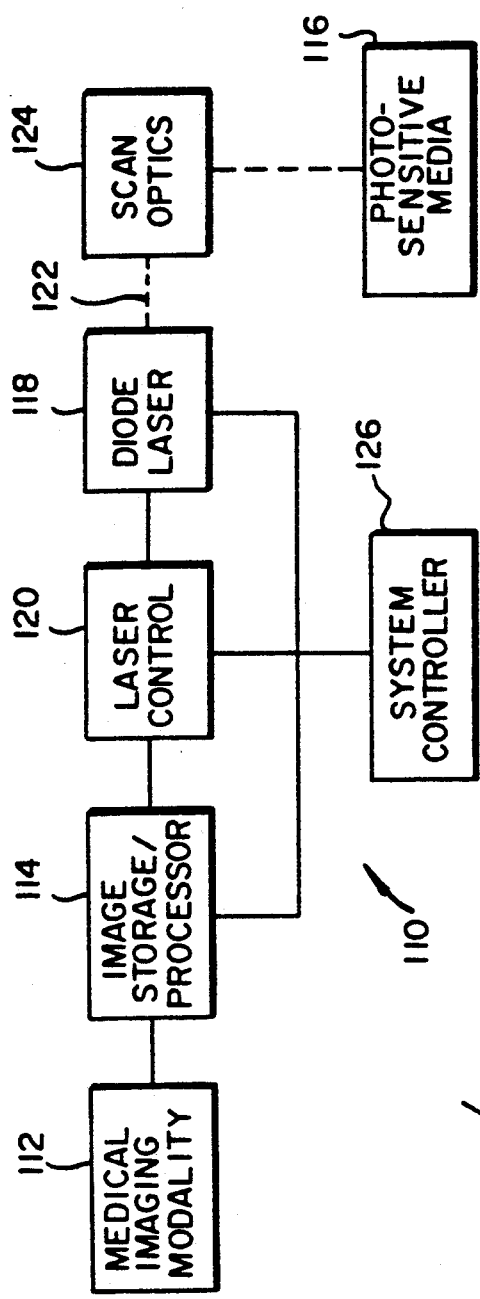
FIG. 12 is a simplified block diagram of an imaging system incorporating a laser diode and an embodiment of the control circuit of the present invention.
Figure 11:
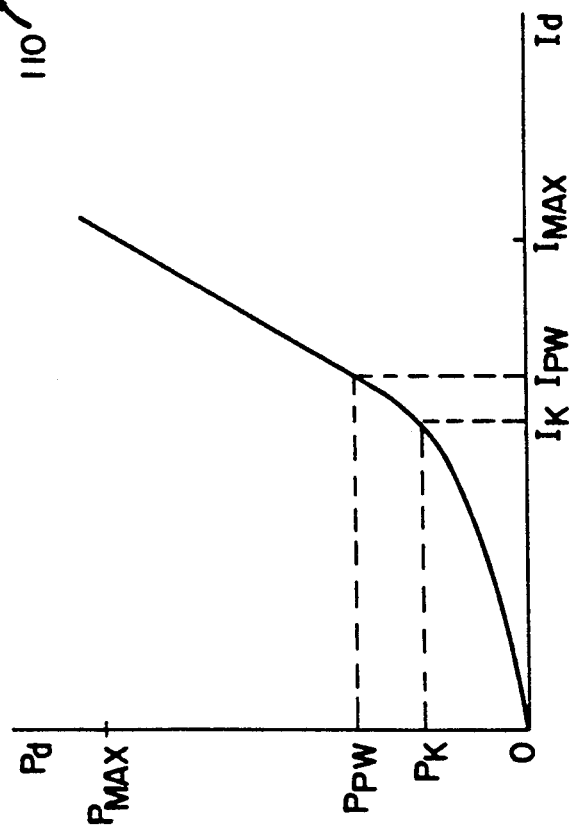
FIG. 11 is a graph of a laser diode operating curve in which illuminative output power P is a function of current I through the laser diode.

Referring now to FIG. 12, there is shown a medical imaging system incorporating an embodiment of the present invention. As shown, system 110 includes a source of a digital medical diagnostic image such as is produced by medical imaging modality 112. Modality 112 may, for example, be a diagnostic imaging modality such as computed tomography modality, magnetic resonance imaging modality, ultrasound modality, digital subtraction angiograpby modality, nuclear medicine modality, or the like. The digital image can also be produced from a storage phosphor, a digitized radiograph or from a digital image archive or storage system. The image produced by modality 112 is digitized and stored in image storage/processor 114. The digital image can be stored in a magnetic or optical disk drive provided in processor 114. The digital image can also be processed by well-known techniques, such as window width-level, tonal gradation, interpolation, edge enhancement, or the like.

A hard copy of the digital image is produced on photosensitive media 116 by means of a laser diode 118 which is controlled by laser control circuit 120, according to the present invention. The laser beam 22 produced by laser diode 118 is shaped and then scanned across media 116 by means of scan optics 124 to produce an image of the digital image on photosensitive media 116 which may, for example, be film, paper or the like. The media 116 is processed to produce a fixed image.

System 110 includes system controller 126, such as a microprocessor which controls processor 114, laser control circuit 120, laser diode 118, and scan optics 124.

Figure 1:
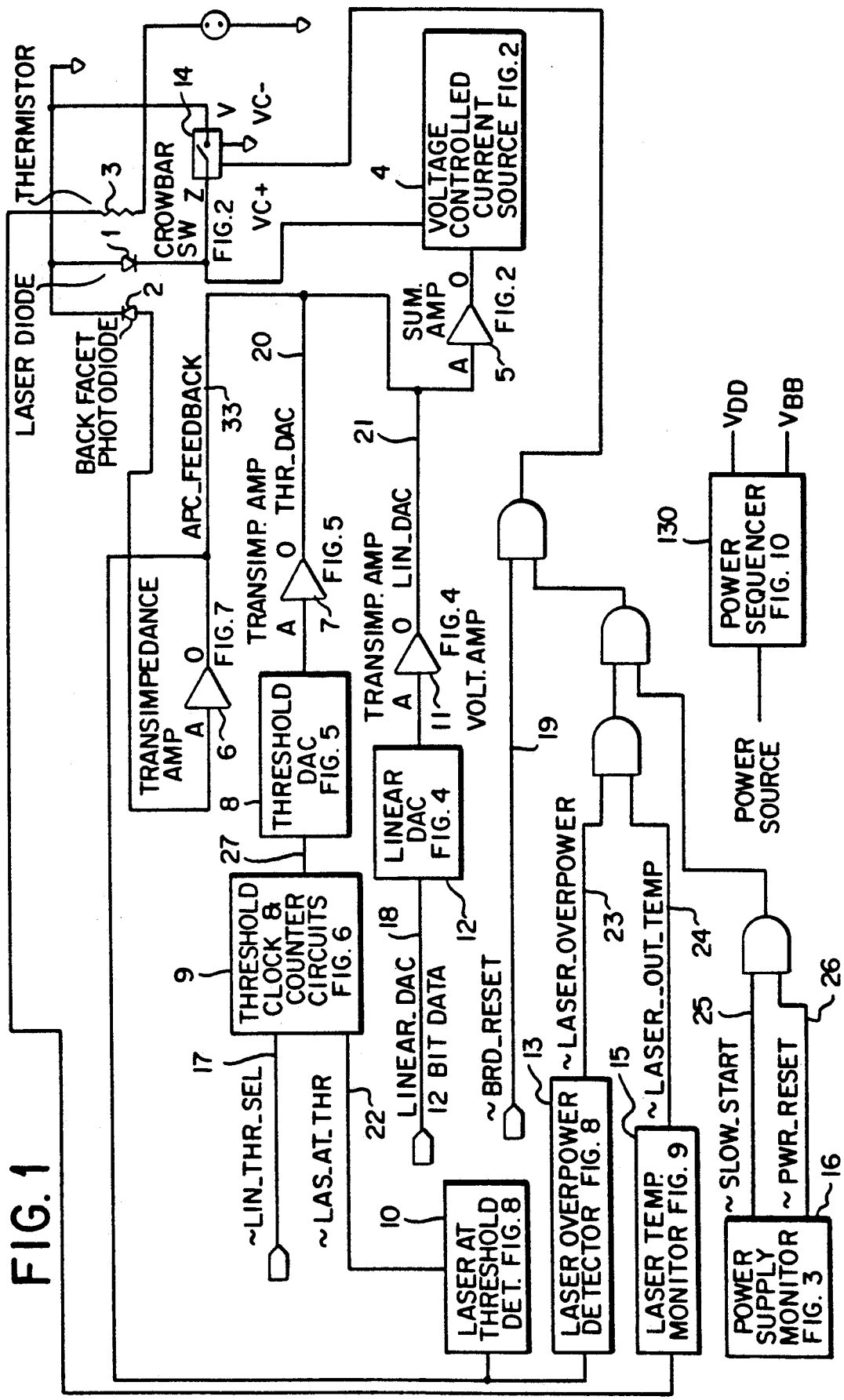
FIGS. 1-10 are schematic electrical diagrams illustrating an embodiment of the present invention.

Refer to FIG. 1 for an overview of an embodiment of the present invention, the function of which is to set and maintain a constant laser output power and to protect the laser diode. The output device 1, is a semiconductor laser diode. The laser output power is monitored by back facet photodiode 2 which monitors the power on the back facet of the laser diode 1. The temperature of the laser diode 1 is monitored by a thermistor 3 which is mounted on a hybrid and has been disclosed in commonly assigned, copending U.S. patent application Ser. No. 792,844, filed Nov. 15, 1991, inventors James G. Davis et al. This application is a continuation-in-part of the latter U.S. Ser. No. 792,844.

The current in laser diode 1 is sourced from voltage controlled current source 4. Input voltages to control the voltage controlled current source 4 are sourced from the summing amplifier (amp) 5. The summing amp 5 has inputs from transimpedance amps 6, 7 and 11. Transimpedance amp 6 converts the current output of the back facet photodiode 2 to a voltage. Transimpedance amp 7 converts the current output of threshold DAC 8 (the threshold Digital to Analog Converter) to a voltage. Transimpedance amp 8 converts the current output of linear DAC 12 (the linear Digital to Analog Converter) to a voltage.

Operation of the circuit begins by autothresholding, which is a means to automatically bring the laser power to a threshold level. An exemplary circuit is disclosed in commonly assigned, copending U.S. patent application Ser. No. 812,509, filed Dec. 20, 1991, inventors James G. Davis et al, for Automatically Setting A threshold Current For A Laser Diode. This application is also a continuation-in-part of the latter U.S. Ser. No. 812,509.

As will be described later, the threshold level is not the same as that defined by laser diode manufacturers, but is a level at which the laser power output functional dependence upon laser current is linear. The auto-threshold sequence is enabled by bringing the digital signal ~LIN_THR_SEL 17 (linear threshold mode select) high. This enables the threshold clock, which clocks counters to increment from an initial value of 000(hex). These counters output twelve bit data 27 to threshold dac 8. This in turn is converted to a voltage level by transimpedance amp 7. Analog signal THR_DAC 20, which is the output of the transimpedance amp 7, is input to summing amp 5, which drives voltage controlled current source 4, which sinks current from the laser diode 1. The laser at threshold detector 10 monitors the laser power, and when a preset laser threshold power is reached causes the digital signal ~LAS_AT_THR 22 to go low, which stops the threshold clock and counter circuit 9 from incrementing the twelve bit data 27. The laser diode 1 is left at a power level above which the laser output power functional dependence upon laser current is linear.

Twelve bit data LINEAR_DAC 18 controls the laser output power from the threshold power to the maximum laser power. Twelve bit data LINEAR_C-DAC 18 is input to linear dac 12. This, in turn, is converted to a voltage level by transimpedance amp 11. Analog signal LIN_DAC 21, which is the output of the transimpedance amp 11, is input to summing amp 5, which drives voltage controlled current source 4, which sinks current from the laser diode 1. The laser overpower detector 13 monitors the laser power. When a preset laser power is reached, the digital signal ~LAS_OVERPOWER 23 is caused to go low, which protects the laser diode 1 by shunting current around the laser, as discussed later.

Negative feedback is used to stabilize the power output of the laser diode 1. This loop consists of the laser diode 1, back facet photodiode 2, transimpedance amp 6, summing amp 5, and voltage controlled current source 4. Functionally, this feedback loop stabilizes the laser diode against variations in laser slope efficiency (change in output optical power per unit current change), and laser threshold current (current at which the laser becomes single mode).

The slope efficiency and threshold current vary as a function of aging of the laser diode and temperature of the laser. Additionally, when this loop is closed, it desensitizes the summing amp 5 response to analog signals THR_DAC 20 and LIN_DAC 21.

Refer to FIG. 1 for the following discussion of protection of laser diode 1. The purpose of the protection circuit, according to the present invention, is to provide a means to protect the laser diode 1 from over laser beam power conditions, over and under temperature conditions, and transient voltage or current spikes on power up and power down conditions.

The means to protect the laser diode 1 is to shunt the current from the laser diode 1 through a low impedance switch 14, which is a Field Effect Transistor with, for example, less than a 0.5 ohm channel resistance. Shunting the current in such a manner is referred to as placing a crowbar across the laser diode 1.

The power supply monitor 16 monitors the power supply voltage. As will be described later, the power for automatic power control is conditioned by a power sequencing circuit 130. Circuit 130 turns on the negative power supply voltage prior to the positive power supply voltage, and turns off the positive power supply voltage before the negative power supply voltage, when a voltage change (e.g., 2 volts) in the difference between positive and negative power supply voltage is detected. This allows the power monitor 16 to only monitor the positive power supply voltage. An additional benefit of the power sequencing circuit is that the crowbar switch circuit 14, which uses only negative power supply voltage, is energized and operational before the laser drive circuitry is sufficiently energized to drive current through the laser diode. A power-on reset circuit asserts the digital signal ~SLOW_START 21 low, and holds it low for about 1 second after the positive power supply voltage comes on. This places the crowbar switch 14 across the laser diode 1 and insures that the laser diode 1 is protected from power-on transients. When the positive power supply voltage drops (for example, 10%) from its normal 12 volt value the digital signal ~PWR_RESET 26 is asserted low, which places the crowbar switch 14 across the laser diode 1 and insures that the laser diode 1 is protected from power down transients. A power hold circuit keeps the crowbar switch 14 activated and shunting the laser diode for a short period (e.g., about 1.4 seconds) after power is removed from the circuit.

The laser temperature monitor 15 uses thermistor 3 to sense laser temperature. If the temperature is out (either over or under temperature) of a preset temperature window centered at about 25° C., the digital signal ~LASER_OUT_TEMP 24 is asserted low which places the crowbar switch 14 across the laser diode 1 and insures that the laser diode 1 is protected from high temperature and possible thermal runaway conditions. A runaway condition occurs when there is a rise in temperature of integrally packaged laser diode 1 and integral photodiode 2. Such a temperature rise reduces the efficiency of the photodiode 2 and, subsequently, the current output of photodiode 2. The automatic power control circuit senses this as a drop in laser power and increases the laser current. The laser output efficiency is reduced at elevated temperatures, and the added current will further elevate that temperature reducing the efficiency further of both the laser diode 1 and photodiode 2. This cycle of thermal runaway can result in damage and failure of the laser diode 1.

The laser overpower detector 13 senses when the laser power exceeds a preset limit which is less than the maximum operational power of the laser diode 1. When the overpower condition occurs, the digital signal ~LASER_OVERPOWER 23 is asserted low. This places the crowbar switch 14 across the laser diode 1 and insures that the laser diode 1 is protected from reaching a power level which could result in damage and failure.

Following is a more detailed description of the automatic power control (APC) and laser protection circuit of the present invention:

LASER DIODE 1 AND BACK FACET PHOTODIODE 2

The laser diode 1 can, for example, be a 5 mW, 670 nm laser diode. These diodes are much more susceptible to damage from transients than other laser diodes (e.g., infrared laser diodes), and require more detailed protection schemes.

Integral to the laser diode 1 is a photodiode 2, which monitors light output from the back facet of the laser diode 1.

THERMISTOR 3

The temperature of the laser is monitored by a thermistor 3 which is preferably mounted on a hybrid such as the one disclosed in the above-referenced U.S. patent application Ser. No. 792,844, filed Nov. 15, 1991. The thermistor 3 consists of three squares of thermistor ink. The ink squares are electrically in series and are silk screened upon a ceramic substrate using thick film hybrid technology. The thermistors are in series with a fixed resistor which is used to trim the total resistance to 5K. The hybrid also has the laser diode 1 mounted upon it and places the thermistors in direct contact with the laser diode case for efficient thermal monitoring of laser diode 1.

VOLTAGE CONTROLLED CURRENT SOURCE 4 AND SUMMING AMP 5

Figure 2:
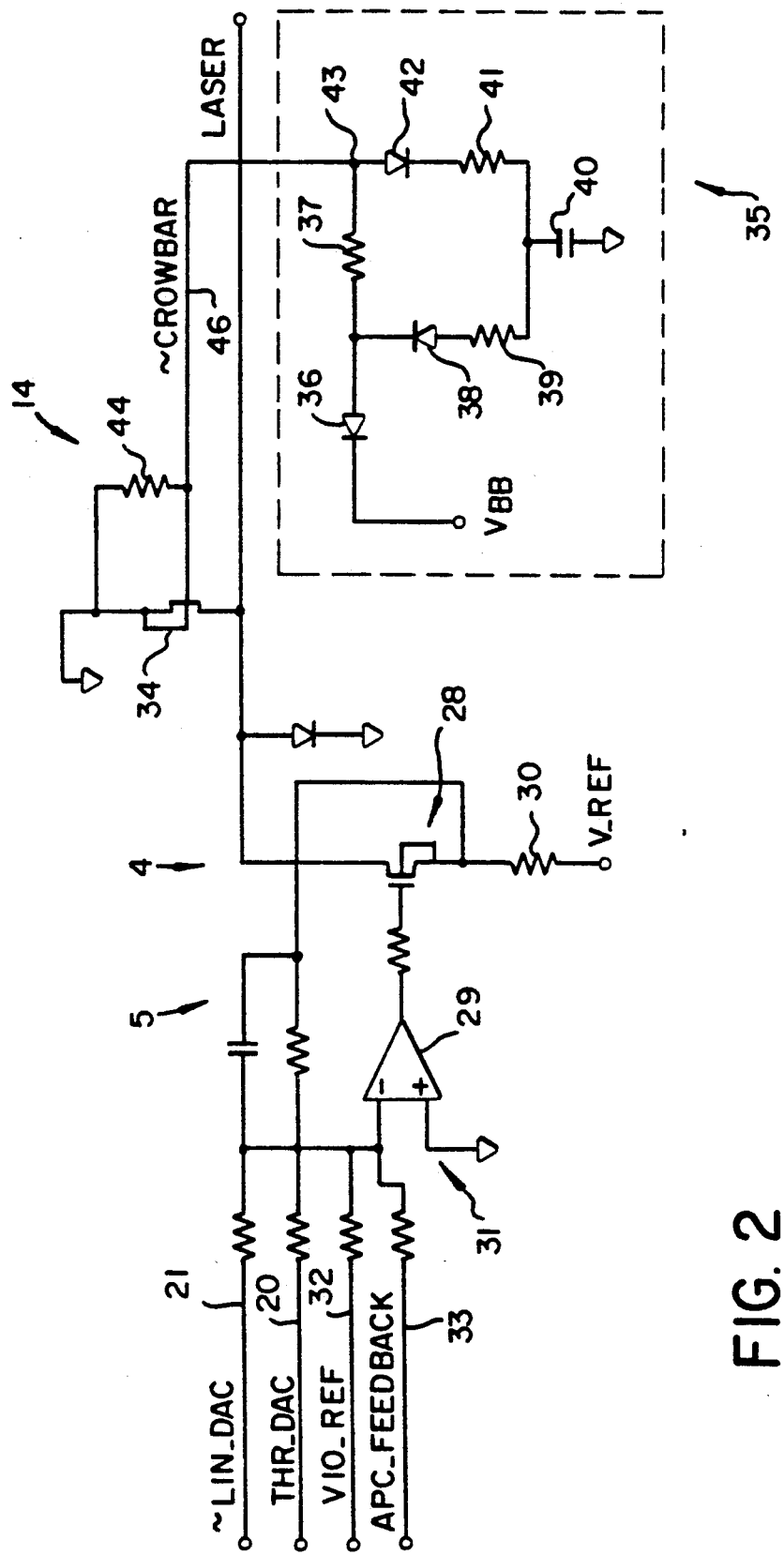

FIG. 2 shows the voltage controlled current source 4 which, for example, is an n channel enhancement mode FET type transistor 28. The voltage from gate to source, or Vgs, controls the current output of the FET 28. The voltage at the gate of transistor 28 is set by the output of summing operational amp 29, and the amp 29 senses the voltage at the top of resistor 30.

At start up, the only input to the summing operational amp 23 summing node 31 is the VIO_REF signal 32, which is adjusted to establish no voltage drop across the resistor 30, and thus no current through the current source FET. VIO_REF 32 provides a means to null out any input offset voltage effects from the various inputs to the summing operational amp 29, in addition to establishing a negative voltage, such as −8.1 volts, at the junction between FET 28 and resistor 30 to set the current output to 0 mA.

The THR_DAC 20 input to the summing operational amp 29 summing node 31 is used to bring the laser power of laser diode 1 to a threshold level, e.g., of about 0.5 mW. The LIN_DAC 21 input to the summing operational amp 29 summing node 31 is used to vary the laser power, e.g., between 0.5 and 4.5 mw. APC_FEEDBACK 33 is used to stabilize the laser power and its sources from the photodiode 2 transimpedance amp 6 in FIG. 1.

CROWBAR SWITCH 14 AND POWER MONITOR

FIG. 2 further shows the detail of FIG. 1's crowbar switch 14, which is a p channel enhancement mode FET type transistor 34. In the example described, the gate of FET 34 must be about 2 volts lower than the source 4 which is at ground potential for the transistor 34 to be on, or the crowbar switch 14 to be closed.

A power hold circuit 35, used to hold power to the crowbar switch 14 on power down, consists of diode 36, resistor 37, diode 38, resistor 39, capacitor 40, resistor 41 and diode 42. On power up, capacitor 40 is charged through current path resistor 39, diode 38 and diode 36. A power sequencer circuit 130 (FIG. 10) insures that VBB=−12 volts is active prior to VDD=+12 volts. This allows capacitor 40 to be fully charged. On power down, diode 36 becomes reversed biased, isolating the crowbar node 43 from VBB as it drops to 0 volts, and connecting it to capacitor 40. The capacitor 40 is slowly discharged through the path resistor 41, diode 42 and resistor 44 to ground. This insures that the crowbar switch 14 shunts laser current for about 1.5 seconds after power drops, and protects the laser from any power down transients.

Figure 3:
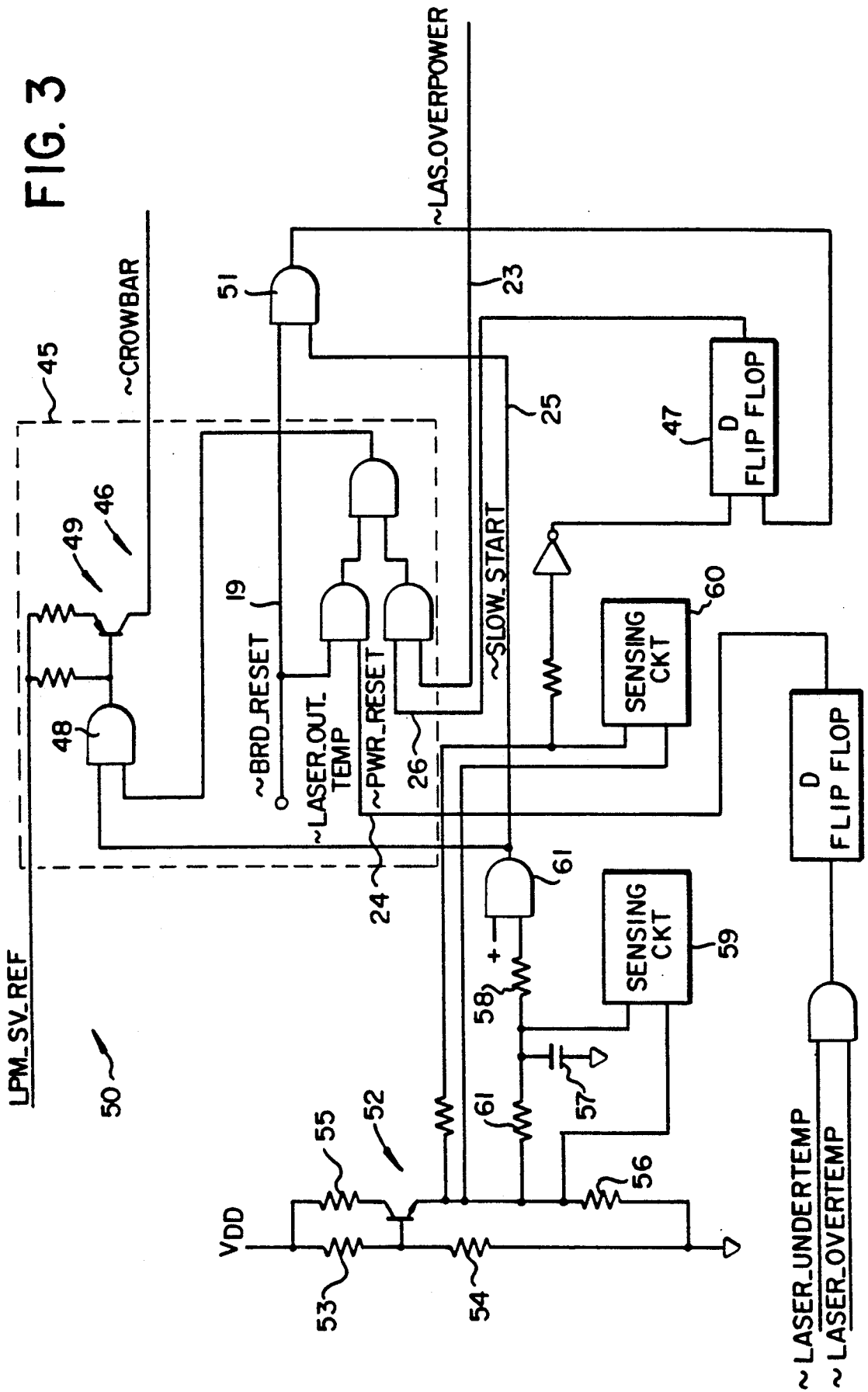

FIG. 3 shows the crowbar drive circuit 45. This circuit 45 was designed to be operational as power is coming up. When ∼CROWBAR 46 is high impedance, and VBB=−12 volts then in FIG. 2, the gate to source voltage of FET 34 is −11.3 volts. FET 34 is turned on and the laser current is shunted by the crowbar FET 34. In the crowbar drive circuit 45 shown in FIG. 3, the output of gate 48 drives the base of transistor 49 and switches the output of transistor 49 between high impedance or the LPM_5V_REF 50, a 5 volt reference. If the output of gate 48 is equal to or less than 0.7 volts different from LPM_5V_REF 50, then transistor 49 is shut off, and its output is in a high impedance state. Gate 48 is driven high by signal ∼BRD_RESET 19 and ∼SLOW_START 25 on power up. ∼SLOW_START 25 remains low for about 0.5 seconds after VDD=12 volts. Gates 48 and 51 are preferably FACT technology, which is operational at as little as 2.0 volts, and is guaranteed to have outputs within 0.1 volt of the supply voltage for a high signal. Gate 48 is powered by LPM_5V_REF 50, and as such keeps the base to emitter voltage on transistor 49 at −0.1 volts, which is much less than the required 0.7 volts to turn transistor 49 on, and thus keeps the emitter of transistor 49 in the high impedance state.

Power supply monitor circuit 16, FIG. 3, monitors the positive power supply VDD and produces signals ∼SLOW_START 25 and ∼PWR_RESET 26. Monitor circuit 16 has a divider network including transistor 52 having a base connected to the junction of resistors 53 and 54 between VDD and ground, a collector connected by resistor 55 to VDD and an emitter connected by resistor 56 to ground. Resistor 61 and capacitor 57 form a delay circuit for sensing circuit 59. Undervoltage sensing circuits 59 and 60 respectively sense whether VDD voltage is over a predetermined value. For a preset delay determined by the time constant of 61,57 circuit 59 senses an under voltage, it produces ∼SLOW_START signal. When circuit 60 senses an under voltage, it produces signal ∼PWR_RESET through D flip-flop 47 with no delay. Both of these signals actuate crowbar switch 14. Circuit 59 is used to crowbar the laser on power up with a delay. Circuit 60 is used to rapidly detect power VDD falling and crowbar the laser on power down.

After power is stable for plus 0.5 seconds, ∼SLOW_START 25 goes high. ∼BRD_RESET 19 must be released by software to remove the crowbar shunt and allow the laser diode I to operate. Other signals which, when asserted (low), cause the laser current to be shunted by the crowbar FET 34 are: ∼LASER_OUT_TEMP 24, ∼PWR_RESET 26, AND ∼LASER_OVERPOWER 23. ∼LASER_OUT-TEMP 24 is asserted when the laser diode 1 has a temperature which is determined to be either above or below a desirable temperature range. An above temperature condition leads to degradation of the laser diode, and below temperature can cause condensation upon the laser. A below temperature condition can indicate a broken connection to the thermistor which, with a negative temperature coefficient, can cause heating of the laser and lead to thermal run away and destruction of the laser diode. ∼POWER_RESET 26 is asserted when the positive power supply VDD drops about 10% below 12 volts. This crowbars the laser. ∼LASER_OVERPOWER is asserted when the current feedback from the photodiode indicates the laser power is above a preset maximum power level.

THRESHOLD OPERATION

Figure 5:
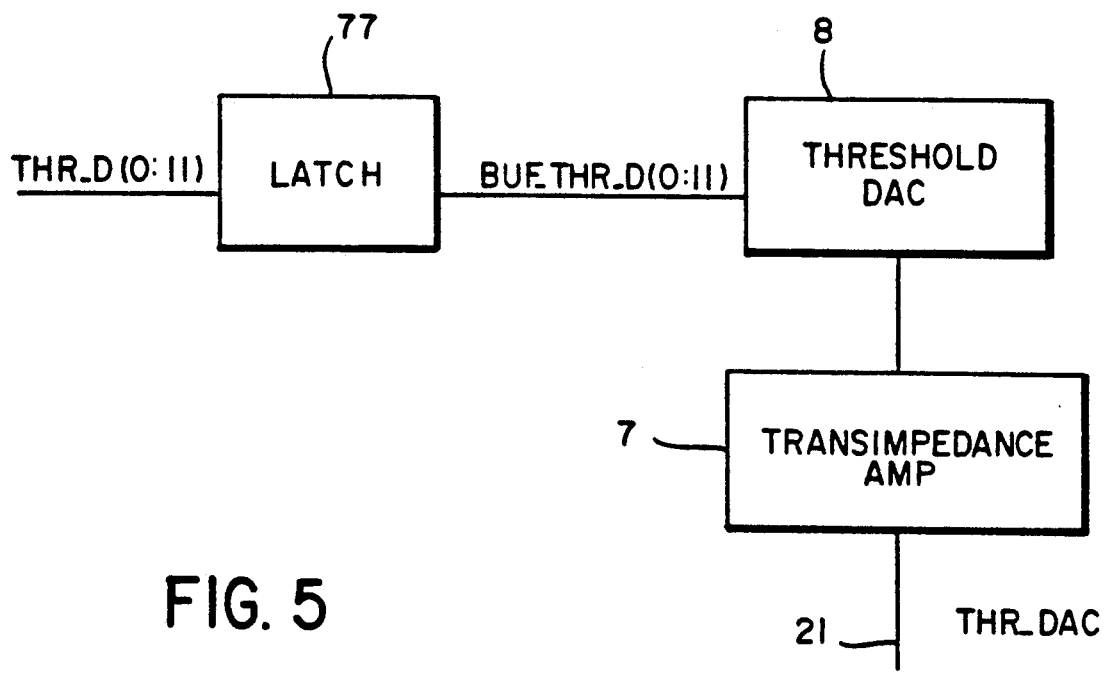
Figure 6:
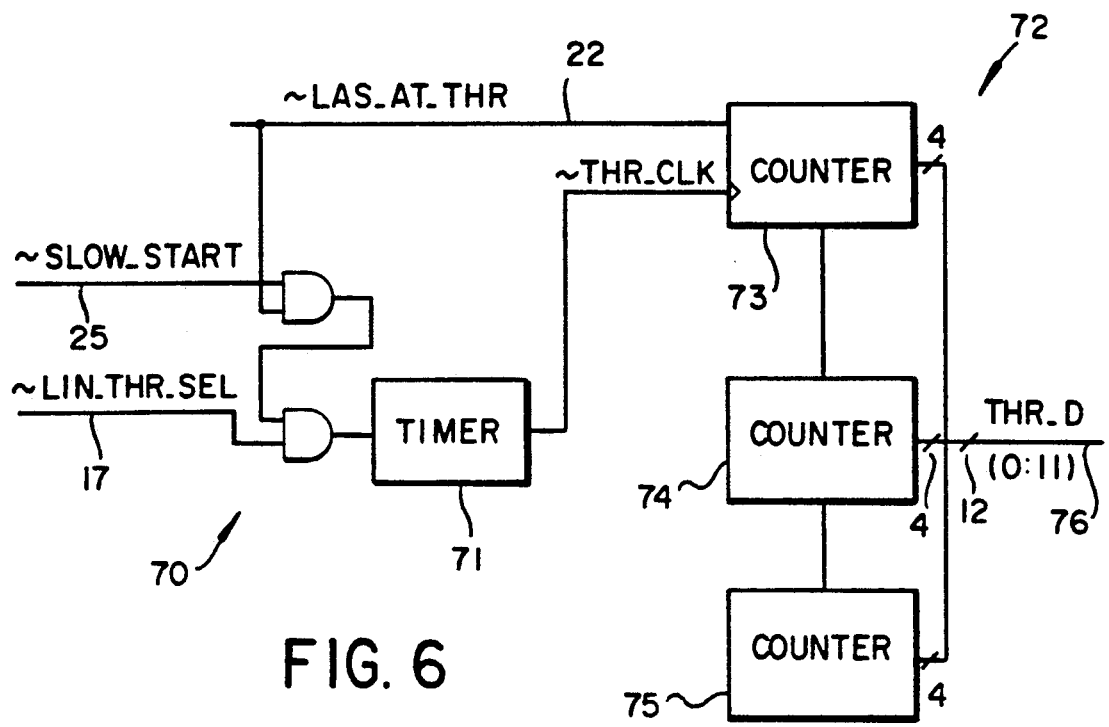

Refer to FIGS. 1, 5 and 6. The threshold clock 70 includes a timer 71 (such as an NE555), which is enabled by all three signals ∼LAS_AT_HR 22, ∼SLOW_START_ 25, and ∼LIN_THR_SEL 17 being in the high state. In normal operation, ∼SLOW_START 25 is low for about 1 second after power is stabilized, ∼LAS_AT_THR 22 and ∼LIN_THR_SEL 17 are set high by hardware on power up. When software writes ∼LIN_SEL 17 high, the threshold clock 70 is enabled to oscillate, until the laser diode 1 at threshold condition is reached and signal ∼LAS_AT_THR 22 is asserted low inhibiting the threshold clock.

The threshold clock 70 clocks the threshold counter 72, which is initially cleared on power up and then counts from 000 to FFF(hex) until inhibited by the assertion of ∼LAS_AT_HR 22 low. Counter 72 can be, for example, a 12 bit counter including cascaded 4 bit counters 73, 74 and 75.

THR_D(0:11) 76, the 12 bit digital output of the threshold counter 72, is latched in 12 bit latch 77 whose output is used as the input to the 12 bit digital to analog converter 8 (FIG. 5). The DAC 8 output is converted via a transimpedance amp 7 to provide the analog voltage input (THR_DAC 20) for summing amp 5, which drives the voltage controlled current source 4.

LINEAR OPERATION

Figure 4:
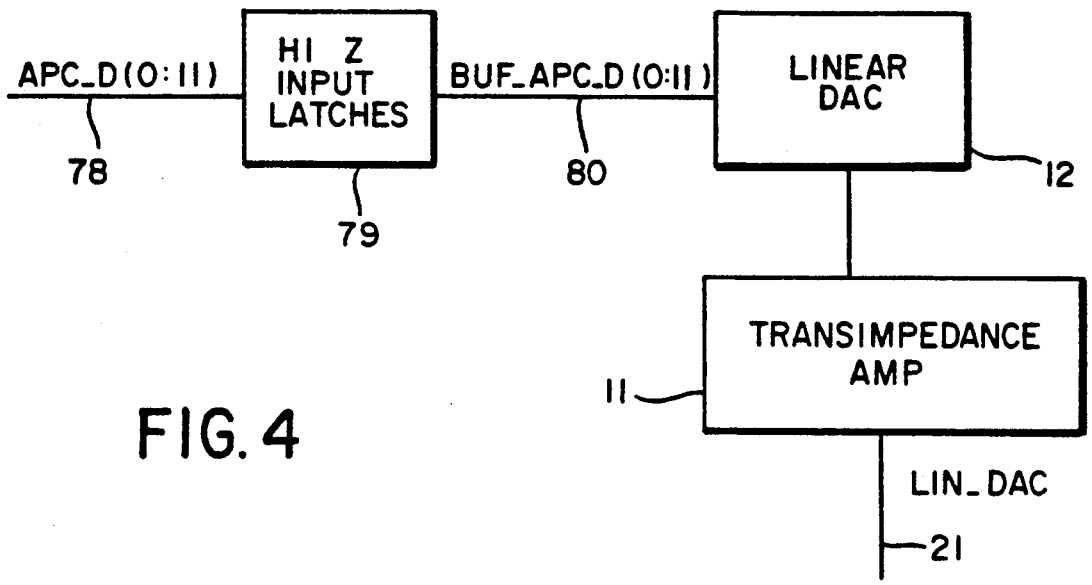

Refer now to FIGS. 1 and 4. The 12 bit digital data APC_D(0:11) 78 is input to HI-Z input latch 79. This latched data BUF_APC.D(0:11) 80 is converted to the analog signal LIN_DAC 21 by the linear DAC 12 and its transimpedance amp 11.

Linear operation of the laser diode 1 ranges from a minimum power at threshold to a maximum power.

LASER AT THRESHOLD 22 AND LASER OVERPOWER DETECTOR 15

Figure 8:
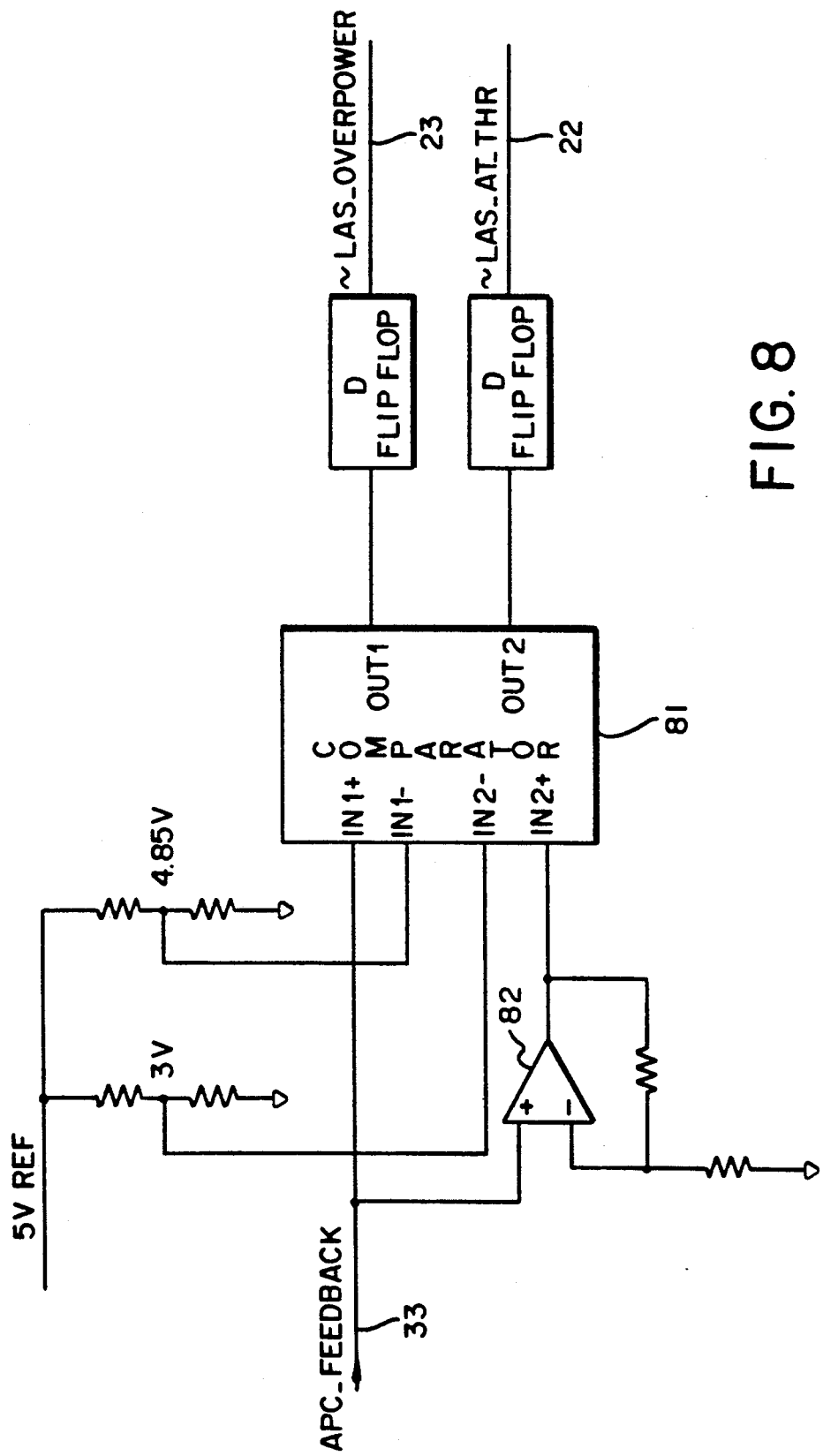

Refer now to FIG. 1 and 8. A high speed comparator 81, such as an Elantec EL2252 component, is used to compare the APC_FEEDBACK signal 33 to a reference voltage.

The ~LASER_OVERPOWER signal 23 is asserted (low) when the APC_FEEDBACK signal 33 equals or exceeds, for example, 4.85 volts which corresponds to a laser power of 4.85 mill. The assertion of ~LASER_OVERPOWER 23 is used to place the crowbar switch 14 shunt across the laser diode 1 and protect it from exceeding the maximum power of 5.0 mW, for example.

The ~LASER_AT_THR signal 22 is asserted (low) when the APC_FEEDBACK signal 33, with a gain of +6 realized by the amplifier 82, equals or exceeds about 3.0 volts which corresponds to a laser power of 0.5 mW. When asserted ~LASER_AT_THR 22 stops the threshold clock 70 and counter 72 circuits and the last value of the counter 72 is latched into the THRESHOLD DAC 8 to hold the laser diode I at the threshold power.

LASER TEMPERATURE MONITOR 15

Figure 9:
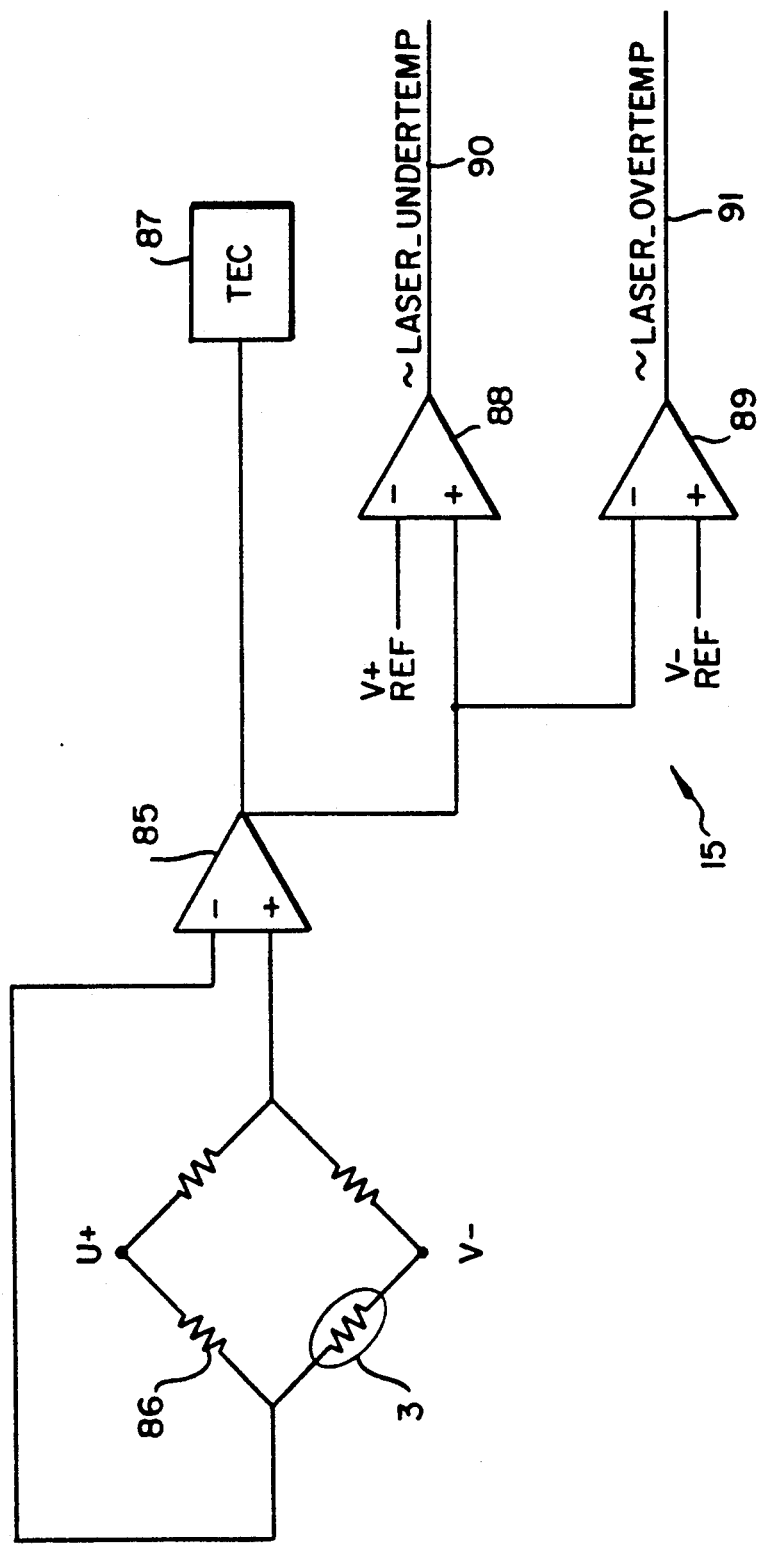

Refer to FIGS. I and 9. In FIG. 9, amplifier 85 is used to amplify the difference between a thermistor 3 resistance and resistor 86, a reference resistor. This generates an error voltage which is used to drive a thermoelectric cooler (TEC) 87 which either heats or cools the laser diode 1. Laser temperature monitor 15 (FIG. 1) includes operational op amps 88 and 89 and associated circuitry which act as a window comparator to determine if the laser diode 1 is above a temperature of about 25° C. or below a temperature of about 25° C. and assert the appropriate signal ~LASER_UNDERTEMP 90 or ~LASER_OVERTEMP 91. Either of these signals 90,91 can apply the crowbar switch 14 to the laser diode 1 to prevent thermal damage. A faulty connection causing an open circuit to a negative temperature coefficient thermistor 3 can appear to be an under temperature condition and cause the TEC 87 (FIG. 9) to apply maximum heat to the laser diode 1. This can reduce the efficiency of the back facet photodiode 2 and cause the laser power servo-loop to overdrive the laser diode 1. In the other condition, where a thermistor 3 is shorted, the laser diode 1 can be cooled to the point where condensation forms on the laser diode 1, causing optical contamination.

POWER SEQUENCER

Figure 10:
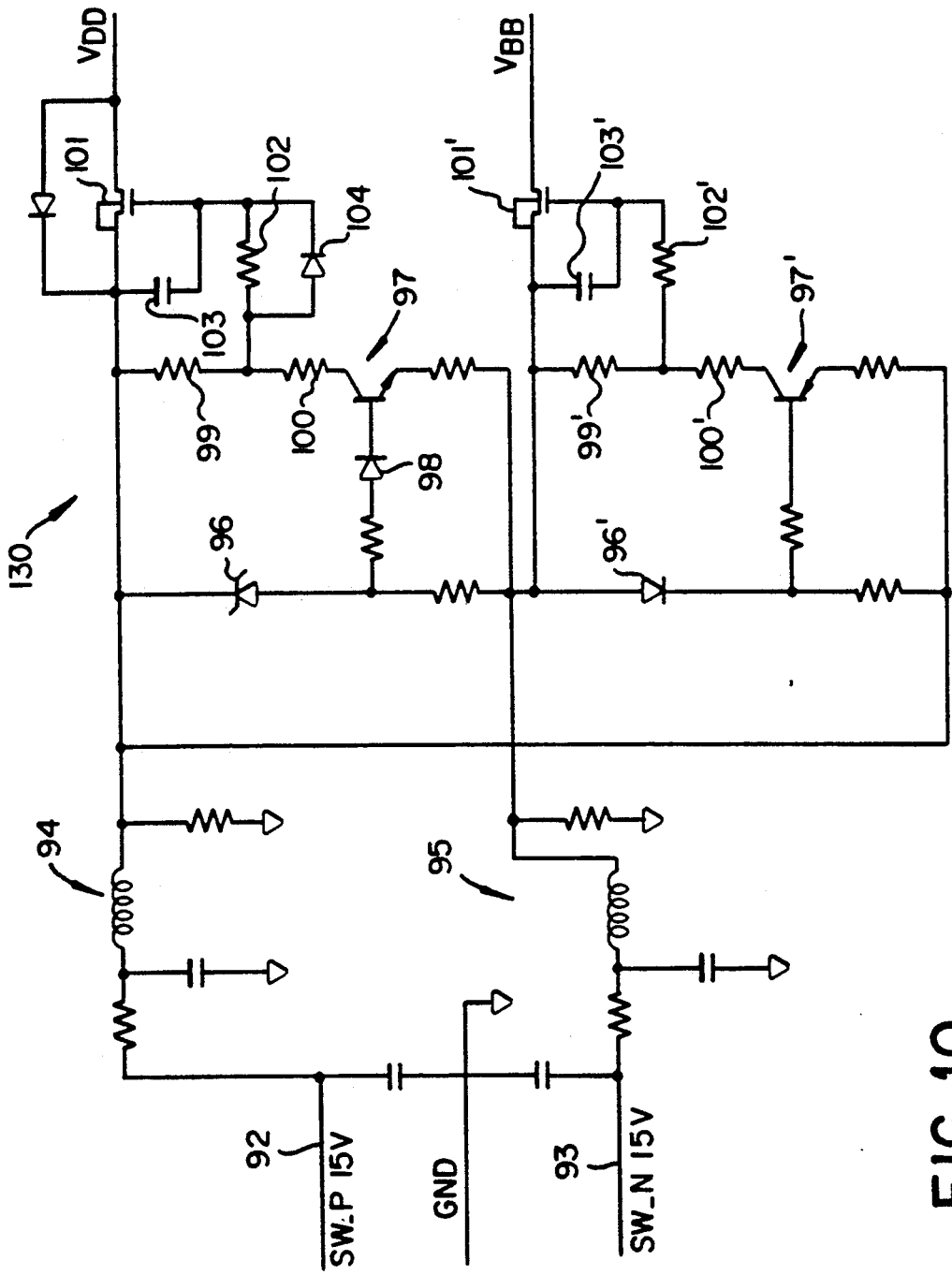

Refer to FIGS. 1 and 10. FIG. 10 shows the power sequencer 130 which has the purpose of monitoring the incoming positive voltage SW_P15V 92 and negative voltage SW_N15V 93, which are respectively plus and minus 15 volts to determine that they are within two volts of summing to a total voltage drop of 30 volts before applying power to the laser drive circuitry. For purpose of explanation, only the top half of the power sequencer circuitry for the positive 12 volts VDD will be described. The bottom half is a mirror image (except for comparable diodes 98 and 104 for the negative 12 volt supply VBB. The signals 92,93 are filtered by filters 94,95 before application to power sequencer 30.

The means of monitoring the power is by using a 28 volt zener diode 96 to drop at least 28 volts ±1% between ±15 volts, so that the base to emitter voltage for transistor 97 is great enough to turn on the transistor 97 only when the supplies have nearly reached ±15 volts. Diode 98 is used in the VDD circuit, but not the VBB circuit to insure that VDD does not come on while VBB has come on due to the 1% tolerance in the zener diodes 96,96'. When transistor 97 is turned on, it draws current through resistors 99,100 into its collector. This drops enough voltage across resistor 99 to turn on transistor 101. A time delay is built in by the time constant of resistor 102 and capacitor 103. This allows about a 12 second delay after ±15 volts have stabilized before VDD comes up. If, during this delay, the power supplies drop, diode 104 provides a path to discharge capacitor 103 rapidly to start the time delay over.

The power sequence for VBB has a time constant one tenth of that of VDD, so that VBB comes on first, and then VDD. The laser protection circuits are energized by VBB, which is why this power comes up first.

Figure 7:
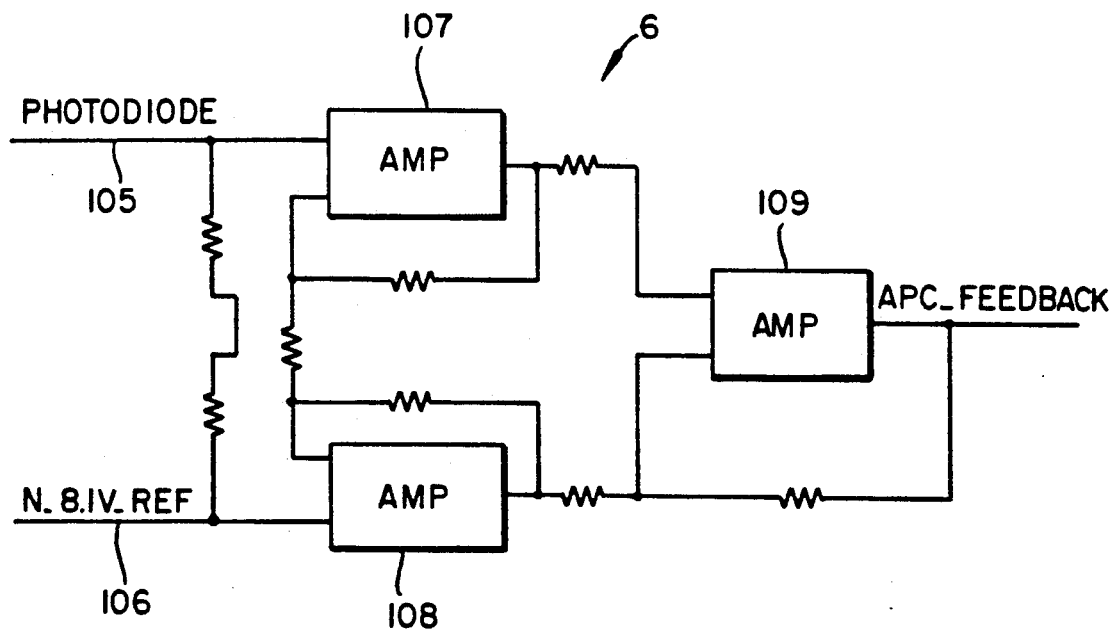

FIG. 7 shows the Back Facet Photodiode 2 transimpedance amp 6. as shown, the signal PHOTO DIODE-105 from photodiode 2 and a negative reference signal N_8.1V REF-106 are applied respectively to op amps 107 and 108 connected in parallel. The outputs of op amps 107 and 108 are input to op amp 109, the output of which is the APC FEEDBACK signal. This signal, as an example, has an output of 1 VOLT/m W of laser power.

Although the invention has been described with reference to preferred embodiments thereof, it will be understood that variations and modifications can be effected within the spirit and scope of the invention as described above and as defined in the appended claims.

What is claimed is:

1. Laser imaging apparatus comprising:
   a laser diode for producing a laser light output;
   electrical power supply means for supplying electrical power to said laser diode;
   shunt circuit means for shunting electrical power around said laser diode;
   image signal means for modulating said laser diode with an image signal;
   laser light power monitor means for monitoring the laser light output of said laser diode;
   thermal monitor means for monitoring the temperature of said laser diode;
   electrical power supply monitor means for monitoring the electrical power supplied to said laser diode; and
   control means for controlling said shunt means to shunt power around 1) during power up and power down conditions, and 2) said laser diode in response to a signal selected from the group consisting of:
   a) a laser overpower signal produced by said laser light power monitor means when said laser light from said laser diode is detected as over a predetermined maximum value;
   b) a laser out of temperature signal produced by said thermal monitor means when the temperature of said laser diode is detected as below or above a predetermined temperatures; and
   c) an electrical power over or under signal produced by said electrical power supply monitor means when the electrical voltage supplied by said electrical power supply means to said laser diode is detected as below or above predetermined voltage values.

2. The laser imaging apparatus of claim 1 wherein said electrical power supply means includes a negative power supply and a positive power supply and including power sequencer means for sequencing said power such that said negative power supply reaches a predetermined negative voltage before said positive power supply reaches a predetermined positive voltage.

3. The laser imaging apparatus of claim 1, including threshold circuit means for bringing said laser diode up to a threshold current before said image signal means modulates said laser diode.

* * * * *